(12) United States Patent
Ko et al.

(10) Patent No.: US 7,927,900 B2
(45) Date of Patent: Apr. 19, 2011

(54) METHOD OF MANUFACTURING THIN FILM TRANSISTOR INCLUDING FORMING A BANK FOR INK JET PRINTING

(75) Inventors: Ick Hwan Ko, Seoul (KR); In Seo Kee, Seongnam-si (KR); Young Gu Lee, Suwon-si (KR); Hong Shik Shim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 397 days.

(21) Appl. No.: 12/078,693

(22) Filed: Apr. 4, 2008

(65) Prior Publication Data

US 2008/0246089 A1    Oct. 9, 2008

(30) Foreign Application Priority Data

Apr. 4, 2007   (KR) .................. 10-2007-0033264

(51) Int. Cl.
*H01L 21/00* (2006.01)
*H01L 21/84* (2006.01)

(52) U.S. Cl. ......................................... 438/38; 438/151

(58) Field of Classification Search ................... 438/38, 438/151; 257/E29.295, E51.006, E21.031, 257/E51.029
See application file for complete search history.

(56) References Cited

U.S. PATENT DOCUMENTS

2003/0067005 A1* 4/2003 De Leeuw et al. .............. 257/72
2007/0023837 A1* 2/2007 Lee et al. ...................... 257/347

FOREIGN PATENT DOCUMENTS

JP   2006-261538    9/2006
KR   1020060072503  6/2006

* cited by examiner

*Primary Examiner* — William M. Brewster
(74) *Attorney, Agent, or Firm* — Harness, Dickey & Pierce, P.L.C.

(57) ABSTRACT

Disclosed is a method of manufacturing a thin film transistor, in which a semiconductor layer and a gate insulating film may be formed through ink jet printing using a single bank, thereby simplifying the manufacturing process and decreasing the manufacturing cost, leading to more economical thin film transistors. The thin film transistor manufactured using the method of example embodiments may be used as a switching element for sensors, memory devices, optical devices, and active matrix flat panel displays.

17 Claims, 7 Drawing Sheets

METHOD OF MANUFACTURING THIN FILM TRANSISTOR INCLUDING FORMING A BANK FOR INK JET PRINTING

PRIORITY STATEMENT

This non-provisional application claims priority under U.S.C. §119 to Korean Patent Application No. 2007-33264, filed on Apr. 4, 2007, with the Korean Intellectual Property Office (KIPO), the entire contents of which are herein incorporated by reference.

BACKGROUND

1. Field

Example embodiments relate to a method of manufacturing a thin film transistor and a thin film transistor manufactured by the same. Other example embodiments relate to a method of manufacturing a thin film transistor, in which a semiconductor layer and a gate insulating film may be formed through ink jet printing using a single bank, thereby simplifying the manufacturing process and decreasing the manufacturing cost, and a thin film transistor manufactured by the same.

2. Description of the Related Art

A thin film transistor (TFT) is used as a switching element and/or a driving element for sensors, memory devices, optical devices and/or active matrix (AM) flat panel displays. The main field of application thereof is for AM flat panel displays, for example, AMLCD and/or AMOLED, the driving voltage of which is controlled by a TFT which is connected to each pixel region.

The structure of the TFT may be two different types, for example, a coplanar type, in which a source and a gate are placed in the same plane, and a staggered type, in which a source and a gate are not placed in the same plane. The staggered type TFT may be further subdivided into an inverted staggered type, in which a gate electrode may be placed under source/drain electrodes, and into a normal staggered type, in which a gate electrode may be placed above source/drain electrodes. The inverted staggered type may be also referred to as a bottom gate type, and the normal staggered type may also be referred to as a top gate type.

A bottom gate type TFT may be manufactured by sequentially forming a gate electrode, a gate insulating film, source/drain electrodes, and a semiconductor layer on a substrate, and a top gate type TFT may be manufactured by sequentially forming source/drain electrodes, a semiconductor layer, a gate insulating film, and a gate electrode on a substrate. For patterning in the above respective steps, deposition, photolithography, and etching may be repeatedly conducted, and a mask may be required in every step. However, deposition must be performed at relatively high temperatures ranging from about 300° C. to about 500° C., and photolithography may incur increased preparation expenses for a mask for patterning. Thus, the manufacturing cost may vary with the number of masks used in the manufacturing process. Also, there is a need for relatively expensive exposure equipment, leading to increased equipment expenses.

Various display devices may have increased display quality and the same flexibility as paper. In addition, process simplification and cost reduction may be important to the manufacturing process. Therefore, an organic thin film transistor (OTFT) may be expected to fulfill requirements for flexibility, process simplification, and cost reduction. However, conventional amorphous silicon TFTs and OTFTS may be disadvantageous because they are manufactured based on a conventional TFT process, and simplifying the process may be relatively difficult.

SUMMARY

Example embodiments have been made keeping in mind the above problems occurring in the related art, and example embodiments provide a method of manufacturing a TFT, in which a semiconductor layer and a gate insulating film may be formed through ink jet printing using a single bank, thus simplifying the manufacturing process and decreasing the manufacturing cost.

Example embodiments provide a TFT manufactured using the above TFT manufacturing method, and various display devices and electronic display apparatuses including the same.

Example embodiments provide a method of manufacturing a thin film transistor including forming a bank for ink jet printing on a substrate and a surface of at least one electrode, wherein a portion of the surface of the at least one electrode is exposed, forming a first layer on a region defined by the bank, including at least the exposed surface of the at least one electrode, through ink jet printing, and forming a second layer on the first layer through ink jet printing using the bank.

The at least one electrode may include source/drain electrodes, the first layer may be a semiconductor layer, and the second layer may be a gate insulating film. On the other hand, the at least one electrode may be a gate electrode, the first layer may be a gate insulating film, and the second layer may be a semiconductor layer. Forming the first layer on a region defined by the bank may include forming the first layer on an area between the source/drain electrodes.

Other example embodiments provide a method of manufacturing a display device including the method of manufacturing the TFT of example embodiments and a method of manufacturing an electronic display apparatus including the method of manufacturing the display device.

Example embodiments provide a TFT including a substrate, source/drain electrodes, a bank, a semiconductor layer, a gate insulating film, and a gate electrode, manufactured using the above methods, and a display device and an electronic display apparatus including the same.

BRIEF DESCRIPTION OF THE DRAWINGS

Example embodiments will be more clearly understood from the following detailed description taken in conjunction with the accompanying drawings. FIGS. 1-5G represent non-limiting, example embodiments as described herein.

FIGS. 3-4 are flowcharts illustrating the process of manufacturing the TFT according to example embodiments;

FIGS. 5A to 5G are views sequentially illustrating the process of manufacturing the TFT of FIG. 1B.

Figure 1A:
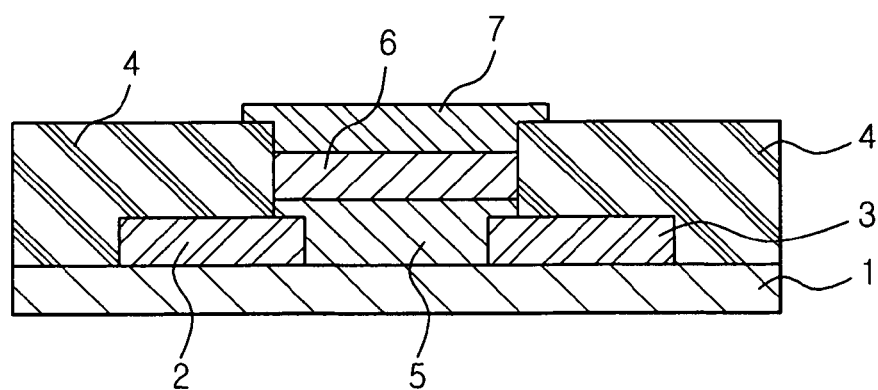
FIGS. 1A-1B are schematic cross-sectional views illustrating the top gate type TFTs manufactured using the manufacturing process according to example embodiments.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, a detailed description will be given of example embodiments with reference to the accompanying drawings. Reference now should be made to the drawings, in which the same reference numerals are used throughout the different drawings to designate the same or similar components. In the drawings, the thicknesses and widths of layers are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments provide a method of manufacturing a TFT including a substrate, source/drain electrodes, a semiconductor layer, a gate insulating film, and a gate electrode, the method including forming a bank for ink jet printing on the source/drain electrodes, other than parts of the end portions of the source/drain electrodes, forming a semiconductor layer on a region defined by the bank, including an area between the source/drain electrodes and areas of the parts of the end portions of the source/drain electrodes, through ink jet printing, and forming a gate insulating film on the semiconductor layer through ink jet printing using the same bank.

Figure 1B:
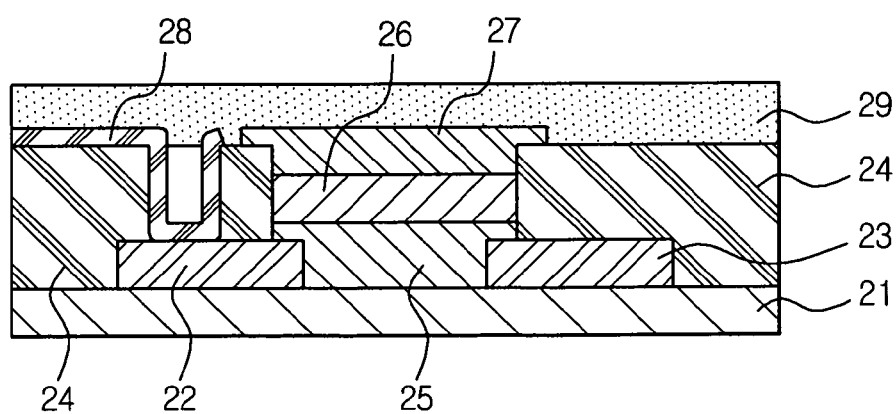

FIG. 1A is a schematic cross-sectional view illustrating the top gate type TFT manufactured using the method of manufacturing the TFT according to example embodiments. The TFT of FIG. 1A may be a top gate type TFT including a substrate 1, source/drain electrodes 2, 3, a bank 4, a semiconductor layer 5, a gate insulating film 6, and a gate electrode 7. FIG. 1B is a schematic cross-sectional view illustrating the TFT manufactured using the method according to example embodiments. The TFT of FIG. 1B may correspond to the TFT of FIG. 1A including a substrate 21, source/drain electrodes 22, 23, a bank 24, a semiconductor layer 25, a gate insulating film 26, and a gate electrode 27, and may further include a pixel electrode 28 and a passivation film 29.

Figure 2A:
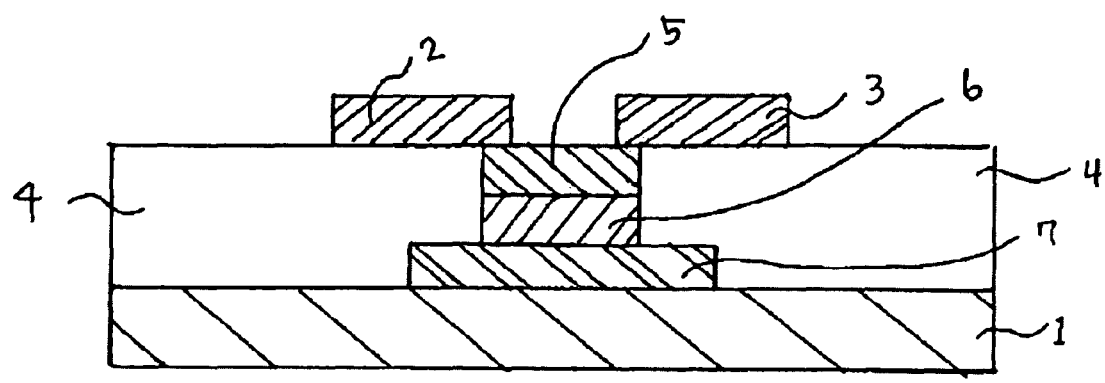
FIGS. 2A-2B are schematic cross-sectional views illustrating the bottom gate type TFTs manufactured using the manufacturing process according to example embodiments.
Figure 2B:
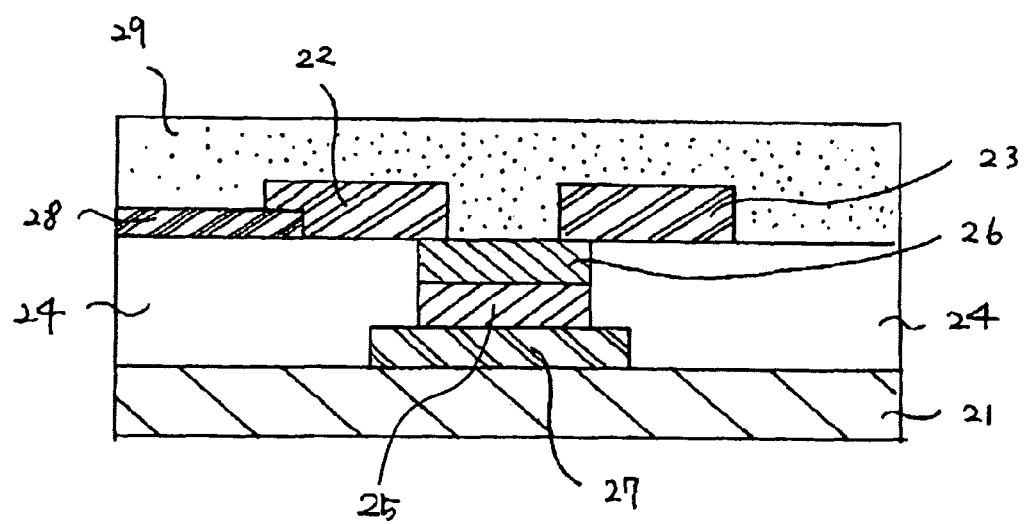

FIG. 2A is a schematic cross-sectional view illustrating the bottom gate type TFT manufactured using the method of manufacturing the TFT according to example embodiments. The TFT of FIG. 2A may be a bottom gate type TFT including a substrate 1, source/drain electrodes 2, 3, a bank 4, a semiconductor layer 5, a gate insulating film 6, and a gate electrode 7. FIG. 2B is a schematic cross-sectional view illustrating the TFT manufactured using the method according to example embodiments. The TFT of FIG. 2B may correspond to the TFT of FIG. 2A including a substrate 21, source/drain electrodes 22, 23, a bank 24, a semiconductor layer 25, a gate insulating film 26, and a gate electrode 27, and may further include a pixel electrode 28 and a passivation film 29.

Figure 3:
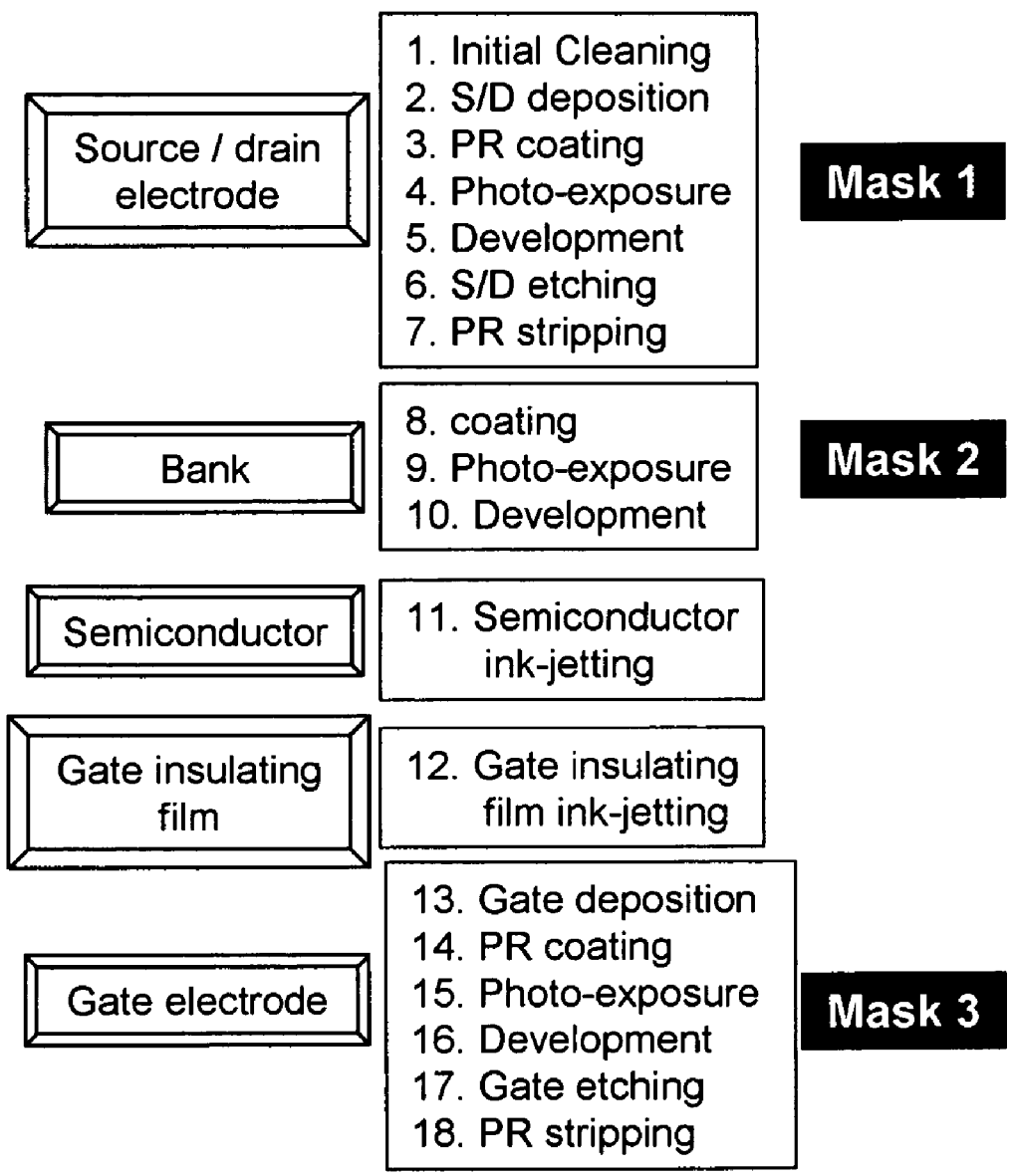

FIG. 3, which is a schematic flowchart illustrating the process of manufacturing the TFT according to example embodiments, sequentially illustrates the process of manufacturing the top gate type TFT of FIG. 1A.

The source electrode and the drain electrode may be formed on the substrate using a conventional method, for example, deposition/photolithography/etching. In addition, the source electrode and the drain electrode may be formed using some other method, for example, ink jet printing.

The substrate may be selected from the group consisting of a silicon substrate having an oxide film grown thereon, a glass substrate, and/or a plastic substrate, but example embodiments may not be limited thereto. After the substrate is cleaned, material for forming the source electrode and the drain electrode may be deposited. The deposition may be conducted according to a conventional TFT manufacturing method. After the source electrode and the drain electrode are deposited, a photoresist may be applied. The photoresist may be selectively exposed to UV light using the mask. Subsequently, the exposed photoresist may be developed, the source/drain electrodes may be etched, and the photoresist may be stripped, consequently forming the source/drain electrodes on the substrate.

Thereafter, the bank may be formed on the source/drain electrodes which may be formed on the substrate before forming the semiconductor layer and the gate insulating film. The bank, which is a type of barrier member, may function to define the region of the substrate to be filled with ink. The bank may be formed on the region of the substrate other than the portion corresponding to a semiconductor layer and a gate insulating film, both of which are to be subsequently formed.

In example embodiments, the bank may be formed on the source/drain electrodes, other than parts of the end portions of the source/drain electrodes. The formation of the bank may be conducted according to a conventional method known in the art. For example, the bank may be formed by applying a composition for forming a bank on the substrate having the source/drain electrodes to thus form a coating film, selectively photo-exposing the coating film using a mask, and conducting development using a developing solution. Additional baking may be performed if necessary.

Examples of material for the bank may include positive or negative photosensitive material selected from the group consisting of photoacryl, polyimide, polyvinylalcohol, polyvinylchloride, polyacrylamide, polyethyleneglycol, polyethylene oxide, polymethylvinylether, polyethyleneimine, polyphenylene vinylene, polyaniline, polypyrrole and mixtures thereof, or inorganic materials, including $SiN_x$ (about $0<x<$ about 1.33) or $SiO_x$ (about $0<x<$ about 2).

After the bank is formed, the semiconductor layer may be formed on the region defined by the bank to come into contact with the exposed end portions of the source/drain electrodes. The semiconductor layer may be formed through ink jet printing. This ink jet printing process may not require photolithography, and thus, the manufacturing process may be simplified. Because material may be directly disposed on the pattern, the amount thereof that is used may be decreased. Ink jet printing may be conducted according to a conventional method. For example, a semiconductor material solution may be discharged from an ink jet recording head to thus fill a desired portion therewith. The semiconductor material solution may be used in an amount greater than the thickness of the final semiconductor layer. The semiconductor material solution may be heated to remove the solvent therefrom in the filling process using the semiconductor material solution.

The semiconductor layer may be formed of material selected from the group consisting of silicon and organic semiconductor materials, capable of being subjected to ink jet printing. The organic semiconductor material may include polymers or small molecules, which are dissolved in an aqueous solution and/or an organic solvent. The polymer organic semiconductor may be dissolved in a solvent, and may be thus suitable for ink jet printing. Among small-molecule organic semiconductors, material able to be dissolved in an organic solvent may be used. Examples of the organic semiconductor material may include, but may not be limited to, polythiophene, polyaniline, polyacetylene, polypyrrole, polyphenylene vinylene, pentacene, and mixtures thereof. When the semiconductor layer is composed of organic semiconductor material, the TFT formed using the TFT manufacturing method of example embodiments may be an OTFT. The semiconductor material may be dissolved in the solvent, including xylene, chloroform, chlorobenzene, trichloroethylene, and dimethylsulfoxide, and may then be used for ink jet printing.

The ink jet printing usable in example embodiments may not be particularly limited, but may include piezo-jetting, discharge using bubbles generated by heat, or discharge by electrostatic force. Piezo-jetting may be advantageous because no heat may be applied to the liquid material, and thus the composition of the material may not be deteriorated.

After the semiconductor layer is formed, the gate insulating film may be formed thereon through ink jet printing using the same bank. Because the same bank for the formation of the semiconductor layer is used, an additional process may not be required. The gate insulating film corresponding to the area of the semiconductor layer may be formed. The gate insulating film may be formed using polymer or inorganic material capable of being subjected to ink jet printing, and may be selected, for example, from the group consisting of polyvinylphenol, polymethylmethacrylate, polyacrylate, polyvinylalcohol, metal oxides, metal nitrides, metal sulfides, $SiN_x$ (about $0<x<$ about 1.33), $SiO_x$ (about $0<x<$ about 2), $Al_2O_3$, and mixtures thereof. The material for the gate insulating film may not affect the semiconductor. For example, the gate insulating film may not be dissolved in the solvent upon formation of the semiconductor, and the material for the gate insulating film may also be the same.

After the gate insulating film is formed, the gate electrode may be formed on the gate insulating film in a conventional method, thereby completing the TFT. Although the gate electrode, the source electrode and the drain electrode are not particularly limited, they may be formed of a material selected from the group consisting of gold (Au), silver (Ag), aluminum (Al), nickel (Ni), molybdenum (Mo), tungsten (W), indium tin oxide (ITO), indium zinc oxide (IZO), polythiophene, polyaniline, polyacetylene, polypyrrole, polyphenylene vinylene, and a mixture of PEDOT (polyethylenedioxythiophene)/PSS (polystyrenesulfonate).

When the semiconductor layer and the gate insulating film are formed through ink jet printing using a single bank, the need for photolithography may be decreased and the number of masks used for photolithography may also be decreased, compared to conventional TFT manufacturing methods. Printing may become economically advantageous by shortening the manufacturing process and achieving cost reduction.

Example embodiments provide a method of manufacturing a TFT, including forming a gate electrode on a substrate, forming a bank for ink jet printing on the substrate and the gate electrode, other than part of the end portion of the gate electrode, forming a gate insulating film on a region defined by the bank including an area of the part of the end portion of the gate electrode through ink jet printing, forming a semiconductor layer on the gate insulating film through ink jet printing, and forming source/drain electrodes on the bank and the semiconductor layer. The TFT manufactured using the above method has a bottom gate structure, and the individual steps of the above method are the same as those of the method of manufacturing the top gate type TFT.

Figure 4:
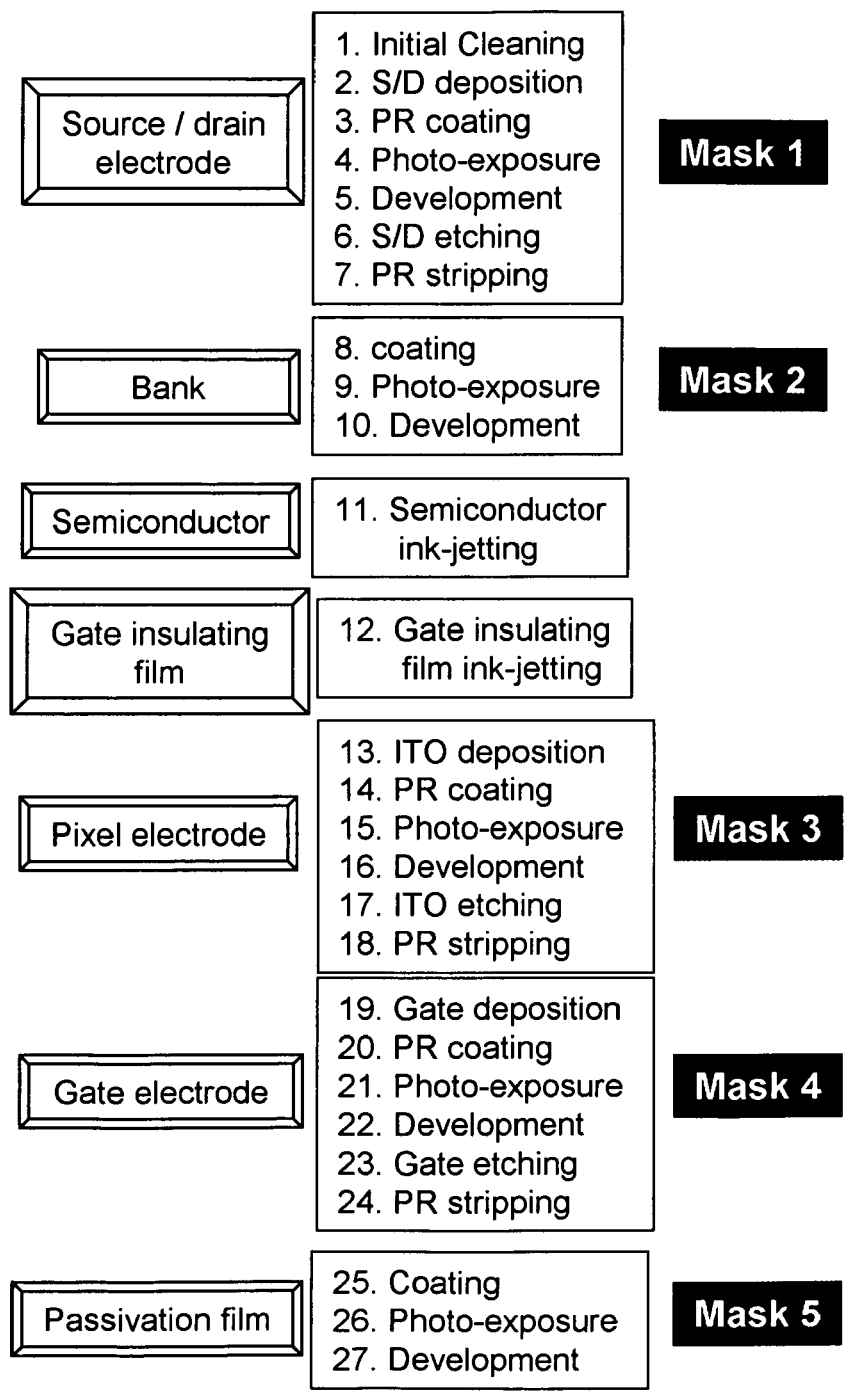

The TFT manufacturing method of example embodiments may further include forming a pixel electrode and forming a passivation film. FIG. 4 is a schematic flowchart illustrating the process of manufacturing the TFT further including forming a pixel electrode 28 and a passivation film 29 as in FIG. 1B.

With reference to FIG. 4, in the case of the top gate type TFT, source/drain electrodes may be formed on the substrate, after which a bank for ink jet printing is formed on the source/drain electrodes, other than parts of the end portions of the source/drain electrodes and the part of the upper portion of the source electrode that comes into contact with a pixel electrode. After the bank is formed as above, a semiconductor layer and a gate insulating film may be sequentially formed on the region defined by the bank, including the area between the source/drain electrodes and the areas of the parts of the end portions of the source/drain electrodes, through ink jet printing. Then, a pixel electrode may be formed through a conventional method. The pixel electrode may be selected from the group consisting of transparent electrodes of indium tin oxide (ITO) and/or indium zinc oxide (IZO), and conductive metal electrodes of Mo and/or Al, but example embodiments may not be limited thereto.

After the pixel electrode is formed, a gate electrode may be formed, and then a passivation film may be formed. The lamination sequence of the pixel electrode, the gate electrode, and the passivation film may be changed. The formation of the passivation film is performed according to a conventional method. For example, the passivation film may be formed through the application of material for the passivation film, UV light exposure, and then development. The material for the passivation film may be selected from the group consisting of polyvinylphenol, polymethylmethacrylate, polyacrylate, polyvinylalcohol, metal oxides, metal nitrides, metal sulfides, $SiN_x$ (about $0<x<$ about 1.33), $SiO_x$ (about $0<x<$ about 2), $Al_2O_3$ and mixtures thereof, but example embodiments may not be limited thereto.

Referring to FIGS. 5A to 5G, the process of manufacturing the TFT of FIG. 1B is sequentially illustrated. In respective drawings, the top plan views of the TFT and the cross-sectional views taken along the lines A-A in the top plan views are illustrated. The TFT manufacturing process is described with reference to FIGS. 5A to 5G.

Figure 5A:
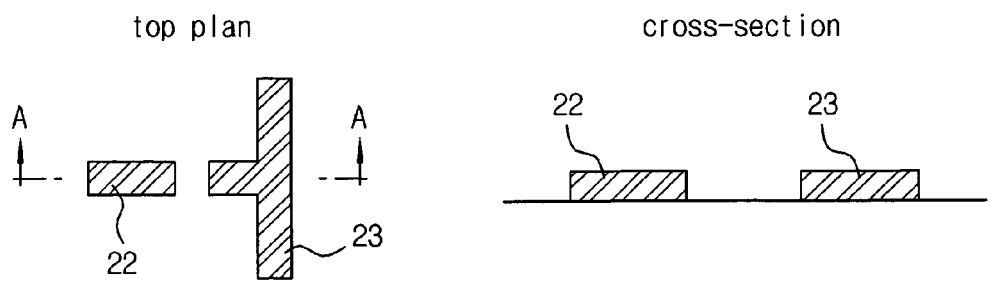

In FIG. 5A, a source electrode 22 and a drain electrode 23 may be formed on a substrate using photolithography. The substrate may be selected from the group consisting of a silicon substrate having an oxide film grown thereon, a glass substrate, and a plastic substrate, but example embodiments may not be limited thereto. After the substrate is cleaned, material for forming the source electrode and the drain electrode may be deposited. This deposition may be conducted using a conventional TFT manufacturing method. For example, the source electrode and the drain electrode may be deposited, followed by performing application of a photoresist, photo-exposure, development, etching of the source/drain electrodes, and stripping of the photoresist, ultimately forming the source/drain electrodes on the substrate. In addition to the above-mentioned deposition/photolithography/etching, the source electrode and the drain electrode may be formed using some other method, for example, ink jet printing.

Figure 5B:
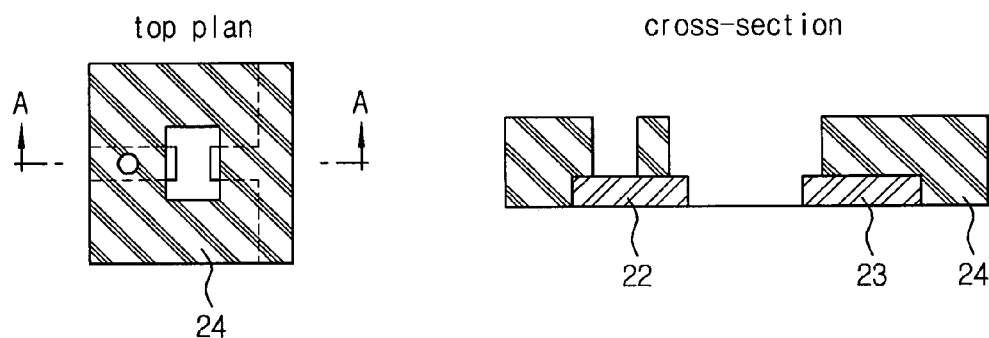

In FIG. 5B, a bank 24 may be formed on the source/drain electrodes 22, 23 which may be formed on the substrate. The bank 24 may be formed on the region of the substrate other than portions corresponding not only to a semiconductor layer and a gate insulating film, which are to be subsequently formed, but to a pixel electrode, which is to be subsequently formed on part of the upper portion of the source electrode. In example embodiments, the bank may be formed on the source/drain electrodes 22, 23, other than parts of the end portions of the source/drain electrodes 22, 23. The bank 24 may be formed through a conventional method known in the art. For example, the bank may be formed through the application of a composition for forming a bank on the substrate having the source/drain electrodes to thus form a coating film, selective photo-exposure of the coating film using a mask, and development using a developing solution. As such, baking may be further conducted, if necessary.

Examples of the material for the bank may include positive or negative photosensitive material, selected from the group consisting of photoacryl, polyimide, polyvinylalcohol, polyvinylchloride, polyacrylamide, polyethyleneglycol, polyethyleneoxide, polymethylvinylether, polyethyleneimine, polyphenylene vinylene, polyaniline, polypyrrole and mixtures thereof, or inorganic materials including $SiN_x$ (about $0<x<$ about 1.33) or $SiO_x$ (about $0<x<$ about 2).

Figure 5C:
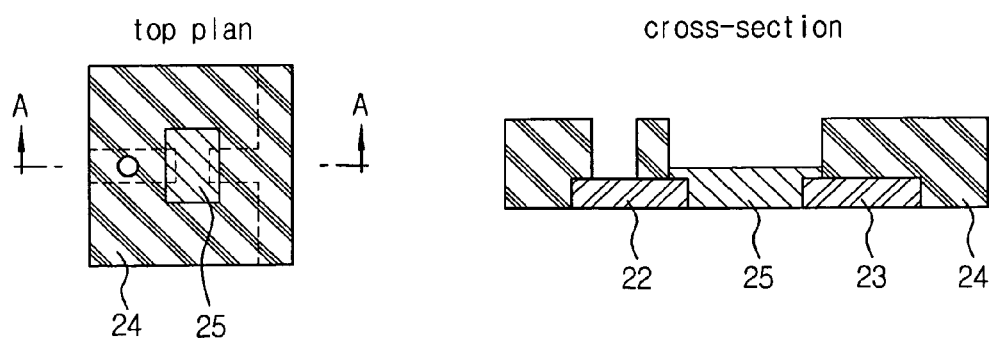

In FIG. 5C, after the bank 24 is formed, a semiconductor layer 25 may be formed on the region defined by the bank 24 to come into contact with the exposed end portions of the source/drain electrodes. The semiconductor layer 25 may be formed through ink jet printing. This ink jet printing may be conducted according to a conventional method. For example, a semiconductor material solution may be discharged from an ink jet recording head to thus fill a desired portion therewith. The semiconductor material solution may be used in an amount greater than the thickness of the final semiconductor layer. The semiconductor material solution may be heated to remove the solvent therefrom in the filling process using the semiconductor material solution.

The semiconductor layer may be formed of material selected from the group consisting of silicon and organic semiconductor materials, capable of being subjected to ink jet printing. The organic semiconductor material may include polymers or small molecules to be dissolved in an aqueous solution and/or organic solvent. Because the polymer organic semiconductor dissolves in a solvent, the polymer organic semiconductor may be suitable for use in ink jet printing. Among small-molecule organic semiconductors, material to be dissolved in an organic solvent may be used. Examples of organic semiconductor material may include, but are not limited to, polythiophene, polyaniline, polyacetylene, polypyrrole, polyphenylene vinylene, pentacene, and mixtures thereof. In the case where the semiconductor layer is composed of organic semiconductor material, the TFT may be an OTFT. For use in ink jet printing, the semiconductor material may be dissolved in a solvent, for example, xylene, chloroform, chlorobenzene, trichloroethylene, and dimethylsulfoxide.

Although the ink jet printing useful in example embodiments is not particularly limited, piezo-jetting, discharge using bubbles generated by heat, or discharge by electrostatic force may be used. Piezo-jetting may be advantageous because no heat may be applied to liquid material, and therefore the composition of the material may not be deteriorated.

Figure 5D:
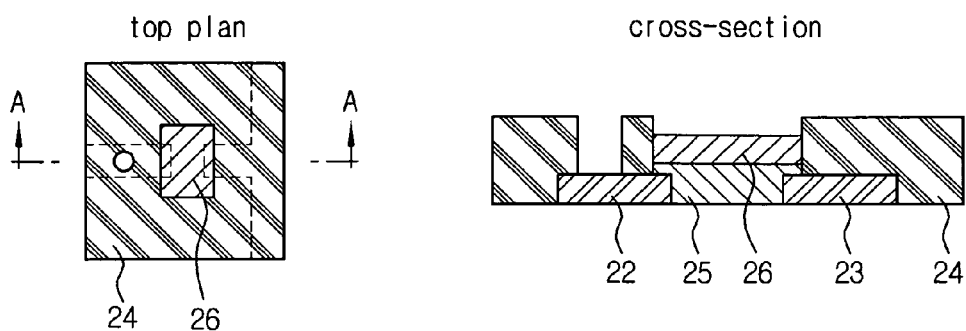

In FIG. 5D, after the semiconductor layer 25 is formed, a gate insulating film 26 may be formed thereon through ink jet printing using the same bank. The same bank as in the formation of the semiconductor layer 25 may be used, and thus there may be no need for an additional process. The gate insulating film corresponding with the area of the semiconductor layer may be formed. The gate insulating film 26 may be formed using polymer and/or inorganic material capable of being subjected to ink jet printing. For example, the material may be selected from the group consisting of polyvinylphenol, polymethylmethacrylate, polyacrylate, polyvinylalcohol, metal oxides, metal nitrides, metal sulfides, $SiN_x$ (about $0<x<$ about 1.33), $SiO_x$ (about $0<x<$ about 2), $Al_2O_3$ and mixtures thereof.

The material for the gate insulating film may not affect the semiconductor. For example, the gate insulating film may not be dissolved in the solvent upon the formation of the semiconductor, and the material for the gate insulating film may also be the same.

Figure 5E:
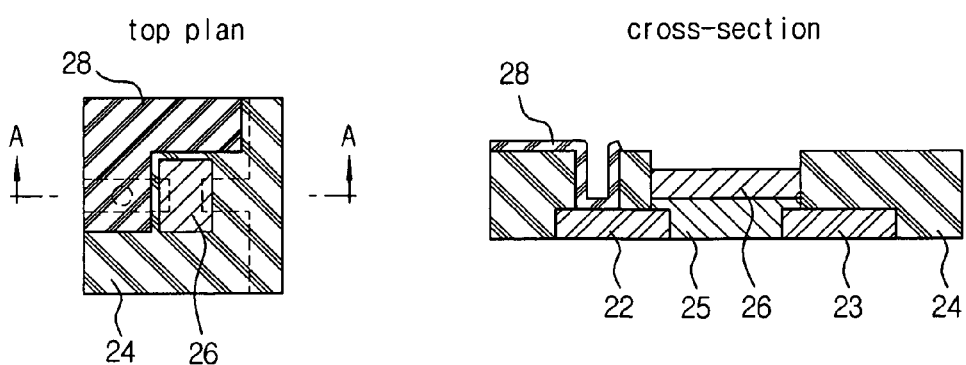

In FIG. 5E, after the gate insulating film 26 is formed, a pixel electrode 28 may be formed on the part of the upper portion of the source electrode corresponding to the portion excluded in the formation of the bank, and on the bank 24 on the source electrode 22. The formation of the pixel electrode may not be particularly limited. For example, deposition of indium tin oxide, application of a photoresist, photo-exposure using a mask, development, etching of indium tin oxide, and stripping of the photoresist may be conducted, thus forming the pixel electrode 28. The pixel electrode 28 may be selected from the group consisting of transparent electrodes of indium tin oxide (ITO) or indium zinc oxide (IZO), and conductive metal electrodes of Mo or Al, but example embodiments may not be limited thereto.

Figure 5F:
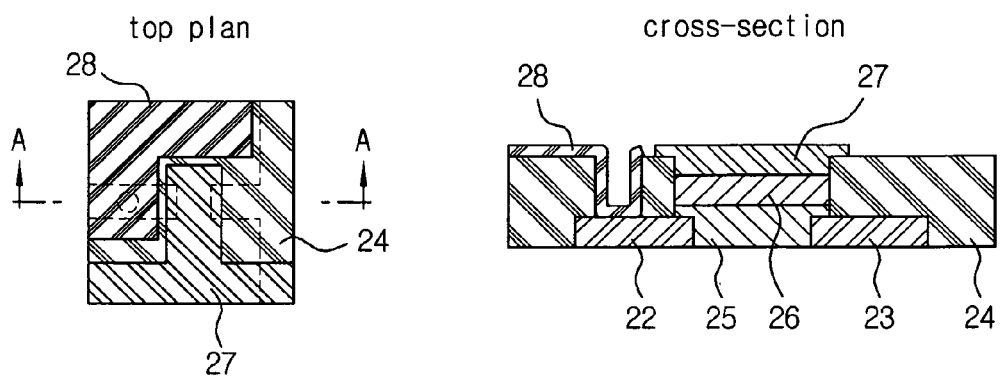

In FIG. 5F, after the pixel electrode 28 is formed, a gate electrode 27 may be formed on the gate insulating film 26 through a conventional method. Examples of material for the gate electrode may include, but may not be limited to, gold (Au), silver (Ag), aluminum (Al), nickel (Ni), molybdenum (Mo), tungsten (W), indium tin oxide (ITO), indium zinc oxide (IZO), polythiophene, polyaniline, polyacetylene, polypyrrole, polyphenylene vinylene, and a mixture of PEDOT (polyethylenedioxythiophene)/PSS (polystyrenesulfonate).

Figure 5G:
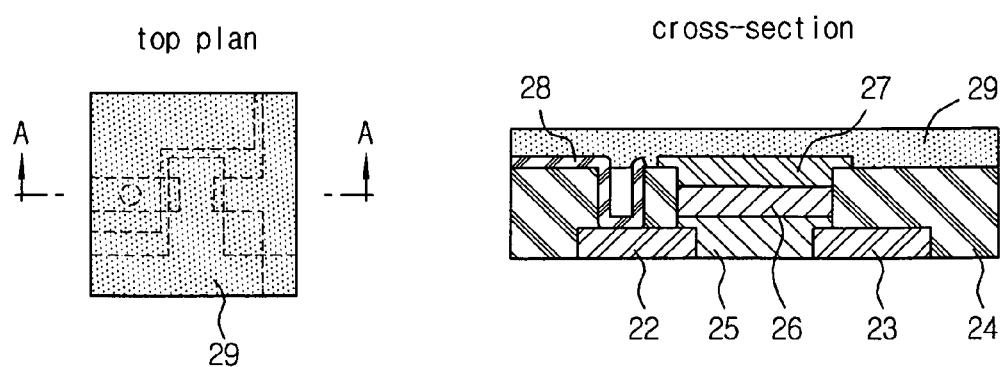

In FIG. 5G, after the gate electrode 27 is formed, a passivation film may be formed on the entire upper surface of the device. The passivation film may be formed through a conventional method, for example, through the application of material for a passivation film, UV light exposure, and then development. The material for the passivation film may be selected from the group consisting of polyvinylphenol, polymethylmethacrylate, polyacrylate, polyvinylalcohol, metal oxides, metal nitrides, metal sulfides, $SiN_x$ (about $0<x<$ about 1.33), $SiO_x$ (about $0<x<$ about 2), $Al_2O_3$ and mixtures thereof, but example embodiments may not be limited thereto.

Example embodiments pertain to a TFT including a substrate, source/drain electrodes, a bank, a semiconductor layer, a gate insulating film, and a gate electrode, which is manufactured using the TFT manufacturing method of example embodiments.

The TFT of example embodiments may include a substrate, source/drain electrodes formed on the substrate, a bank formed on the source/drain electrodes other than parts of the end portions of the source/drain electrodes, a semiconductor layer having a channel formed on the region defined by the bank, a gate insulating film formed on the semiconductor layer, and a gate electrode positioned to correspond to the channel of the semiconductor layer while being insulated from the semiconductor layer. The TFT of example embodiments may be a top gate type TFT. In addition, the TFT of example embodiments may include a bottom gate type TFT, including a substrate, a gate electrode formed on the substrate, a bank formed on the gate electrode other than part of the end portion of the gate electrode, a gate insulating film and a semiconductor layer having a channel formed on the region defined by the bank, and source/drain electrodes formed on the semiconductor layer and the bank. According to the TFT manufacturing method of example embodiments, the semiconductor layer and the gate insulating film may be formed through ink jet printing using a single bank, compared to conventional TFT manufacturing methods, thereby shortening the manufacturing process and reducing the manufacturing cost, resulting in more economical TFTs.

The TFT of example embodiments may further include a pixel electrode and a passivation film. The materials for the substrate, the electrodes, the bank, the semiconductor layer, the gate insulating film, and the passivation film are the same as in the description of the above TFT manufacturing method.

Still a further aspect of example embodiments pertains to a display device and an electronic display apparatus including the TFT. The TFT manufactured through the method of example embodiments may be used as a switching element for sensors, memory devices, optical devices and/or AM flat panel displays.

For example, an organic light emitting diode, to which the TFT of example embodiments is applied, may include an electron injection layer, an electron transport layer, a light emitting layer, a hole transport layer, and a hole injection layer, which may be formed on or underneath the pixel electrode of the TFT. In the case of a liquid crystal display, liquid crystals may be injected between a substrate having the TFT of example embodiments and a substrate having a common electrode, in which such liquid crystal material may be controlled only on the pixel electrode of the TFT. In addition, the display device of example embodiments may be applied to PDPs (Plasma Display Panels), inorganic ELs, and field emission displays (FEDS). The display device of example embodiments may be applied to various electronic display apparatuses, for example, liquid crystal projectors, television sets, electronic organizers, mobile phones and/or POS terminals.

As described hereinbefore, example embodiments provide a method of manufacturing a TFT. According to the method of example embodiments, a semiconductor layer and a gate insulating film may be formed through ink jet printing using a single bank, thereby simplifying the manufacturing process and reducing the manufacturing cost, resulting in more economical TFTs. Further, the TFT manufactured using the method of example embodiments may be used as a switching element for sensors, memory devices, optical devices, and AM flat panel displays.

Although example embodiments have been disclosed for illustrative purposes, those skilled in the art will appreciate that various modifications, additions and substitutions are possible, without departing from the scope and spirit of the accompanying claims.

What is claimed is:

1. A method of manufacturing a thin film transistor comprising:
    forming a bank for ink jet printing on a substrate and a surface of at least one electrode, wherein a portion of the surface of the at least one electrode is exposed;
    forming a first layer on a region defined by the bank, including at least the exposed surface of the at least one electrode, through ink jet printing;

forming a pixel electrode on the bank;
forming a second layer on the first layer through ink jet printing using the bank forming a gate electrode on the second layer; and
forming a passivation film on the exposed upper surface of the pixel electrode, the bank and the gate electrode.

2. The method as set forth in claim 1, wherein the at least one electrode includes source/drain electrodes, the first layer is a semiconductor layer, and the second layer is a gate insulating film.

3. The method as set forth in claim 2, wherein forming the first layer on a region defined by the bank includes forming the first layer on an area between the source/drain electrodes.

4. The method as set forth in claim 1, wherein the at least one electrode is a gate electrode, the first layer is a gate insulating film, and the second layer is a semiconductor layer.

5. The method as set forth in claim 1, wherein the substrate is selected from a group consisting of a silicon substrate having an oxide film grown thereon, a glass substrate, and a plastic substrate.

6. The method as set forth in claim 1, wherein material for the bank is positive or negative photosensitive material selected from a group consisting of photoacryl, polyimide, polyvinylalcohol, polyvinylchloride, polyacrylamide, polyethyleneglycol, polyethylene oxide, polymethylvinylether, polyethyleneimine, polyphenylene vinylene, polyaniline, polypyrrole and mixtures thereof, or inorganic material including $SiN_x$ (about $0<x<$ about 1.33) or $SiO_x$ (about $0<x<$ about 2).

7. The method as set forth in claim 2, wherein the semiconductor layer is formed of material selected from a group consisting of silicon and organic semiconductor materials capable of being subjected to ink jet printing.

8. The method as set forth in claim 7, wherein the organic semiconductor material is selected from a group consisting of polythiophene, polyaniline, polyacetylene, polypyrrole, polyphenylene vinylene, pentacene, and mixtures thereof.

9. The method as set forth in claim 4, wherein the semiconductor layer is formed of material selected from a group consisting of silicon and organic semiconductor materials capable of being subjected to ink jet printing.

10. The method as set forth in claim 9, wherein the organic semiconductor material is selected from a group consisting of polythiophene, polyaniline, polyacetylene, polypyrrole, polyphenylene vinylene, pentacene, and mixtures thereof.

11. The method as set forth in claim 2, wherein the gate insulating film is formed of polymer material capable of being subjected to ink jet printing.

12. The method as set forth in claim 11, wherein the material for the gate insulating film is selected from a group consisting of polyvinylphenol, polymethylmethacrylate, polyacrylate, polyvinylalcohol, metal oxides, metal nitrides, metal sulfides, $SiN_x$ (about $0<x<$ about 1.33), $SiO_x$ (about $0<x<$ about 2), $Al_2O_3$ and mixtures thereof.

13. The method as set forth in claim 4, wherein the gate insulating film is formed of polymer material capable of being subjected to ink jet printing.

14. The method as set forth in claim 13, wherein the material for the gate insulating film is selected from a group consisting of polyvinylphenol, polymethylmethacrylate, polyacrylate, polyvinylalcohol, metal oxides, metal nitrides, metal sulfides, $SiN_x$ (about $0<x<$ about 1.33), $SiO_x$ (about $0<x<$ about 2), $Al_2O_3$ and mixtures thereof.

15. The method as set forth in claim 1, wherein the pixel electrode is selected from a group consisting of indium tin oxide (ITO), indium zinc oxide (IZO), Mo and Al.

16. A method of manufacturing a display device, comprising performing the method of manufacturing the thin film transistor of claim 1.

17. A method of manufacturing an electronic display apparatus, comprising performing the method of manufacturing the display device of claim 16.

* * * * *